United States Patent [19]
Kamiguchi et al.

[11] Patent Number: 6,052,262
[45] Date of Patent: Apr. 18, 2000

[54] MAGNETO-RESISTANCE EFFECT ELEMENT AND MAGNETIC HEAD

[75] Inventors: Yuzo Kamiguchi, Yokohama; Akiko Saito, Kawasaki; Hideaki Fukuzawa, Sagamihara; Hitoshi Iwasaki, Yokosuka; Masashi Sahashi, Yokohama, all of Japan

[73] Assignee: Kabushiki Kaisha Toshiba, Japan

[21] Appl. No.: 09/038,848

[22] Filed: Mar. 12, 1998

[30] Foreign Application Priority Data

Mar. 14, 1997 [JP] Japan ..................... 9-061477

[51] Int. Cl.⁷ ..................................... G11B 5/39
[52] U.S. Cl. ............................................. 360/113
[58] Field of Search .................. 360/113; 338/32 R; 324/252; 428/693, 611, 928

[56] References Cited

U.S. PATENT DOCUMENTS

| | | | |
|---|---|---|---|
| 5,135,818 | 8/1992 | Shimada et al. | 428/693 |
| 5,206,590 | 4/1993 | Dieny et al. | 360/113 X |
| 5,549,978 | 8/1996 | Iwasaki et al. | 428/692 |
| 5,585,199 | 12/1996 | Kamiguchi et al. | 428/621 |
| 5,585,986 | 12/1996 | Parkin | 360/113 |
| 5,648,885 | 7/1997 | Nishioka et al. | 360/113 |

FOREIGN PATENT DOCUMENTS

| | | |
|---|---|---|
| 60-251682 | 12/1985 | Japan . |
| 1-081208 | 3/1989 | Japan . |
| 2-040972 | 2/1990 | Japan . |
| 2-152208 | 6/1990 | Japan . |
| 3-016105 | 1/1991 | Japan . |
| 8-036716 | 2/1996 | Japan . |
| 8-264861 | 10/1996 | Japan . |
| 9-007874 | 1/1997 | Japan . |

OTHER PUBLICATIONS

Wang et al., "Ion Beam Deposition and Structural Characterization of GMR Spin Valves," S.X. IEEE Transactions on Magnetics, vol. 33, No. 3. (1997), pp. 2369–2374.

Baibich, et al., "Giant Magnetoresistance of (001)Fe(001) Cr Magnetic Superiattices," Phys. Re Lett., vol. 61, 2472 (1988).

Parkin et al., "Oscillations in Exchange Coupling and Magnetresistance in Metallic Superlattice Structures: Co/Ru, Co/Cr, and Fe/Cr." Phys. Rev. Lett., vol. 64, 2304 (1990).

Dieny, "Giant magnetorisistance of magnetically soft sandwiches: Dependence on temperature and on layer thickness", Phys. Rev. B., vol. 45, 806 (1992).

Dieny, et al., Magnetotransport properties of magnetically soft spin–valve structures, J. appl. Phys., 69(8), pp. 4774–4779 (1991).

*Primary Examiner*—William Klimowicz
*Attorney, Agent, or Firm*—Finnegan, Henderson, Farabow, Garrett & Dunner

[57] ABSTRACT

A magneto-resistance effect element comprising a spin valve film including a first magnetic layer, a second magnetic layer and a non-magnetic layer interposed between the first magnetic layer and the second magnetic layer. Among the first and the second magnetic layers, in at least one of the magnetic layers, close-packed faces of crystal grains which constitute the magnetic layer are isotropically dispersed. Such a magnetic layer, by setting a film thickness of an under layer having an identical crystal structure with the magnetic layer at 2.0 nm or less and by dispersing isotropically close-packed faces of crystal grains constituting the under layer, can be obtained with reproducibility. According to a magneto-resistance effect element comprising such a spin valve film, while maintaining a large MR change rate, for example, magnetostriction constant can satisfy such a low magnetostriction as $1 \times 10^{-6}$ or less. Further, excellent soft magnetic property can be provided.

22 Claims, 10 Drawing Sheets

MAGNETO-RESISTANCE EFFECT ELEMENT AND MAGNETIC HEAD

BACKGROUND OF THE INVENTION

1. Field of the Invention

The present invention relates to a magneto-resistance effect element having a spin valve film and a magnetic head using thereof.

2. Description of the Related Art

Responding to a recent trend towards down-sizing and high capacity of a magnetic recording medium, an expectation for a magnetic head (MR head)taking advantage of magneto-resistance effect (MR) which enable to extract a large output is growing high. An MR head has a magneto-resistance effect element (MR element) taking advantage of a magneto-resistance effect film.

In a conventional magneto-resistance effect film, a ferromagnetic material such as a Ni-Fe alloy and the like which shows an anisotropic magneto-resistance effect (AMR) has been used. However, since a magneto-resistance change rate (MR change rate) of an AMR film is at most only about 3%, it is insufficient for a down-sized/high capacity magnetic recording medium. Therefore, a magneto-resistance effect film showing much high sensitivity in the magneto-resistance effect is demanded.

Responding to such a demand, a multi-layer film such as an Fe/Cr or a Co/Cu in which a ferromagnetic metal film and a non-magnetic metal film are alternately stacked under a certain condition and the neighboring ferromagnetic metal films are coupled anti-ferromagnetically, namely a so-called artificial lattice film, is ascertained to show a giant magneto-resistance effect. In an artificial lattice film, an MR change rate at most exceeding 100% is reported (refer to Phys. Rev. Lett., Vol. 61, 2474 (1988), Phys. Rev. Lett., Vol. 64, 2304 (1990)). However, since the artificial lattice film is high in its saturation magnetization, it is not suitable for an MR head.

On the contrary, in a magnetic multi-layer film of a sandwich structure of a ferromagnetic layer/a non-magnetic layer/a ferromagnetic layer, even when the ferromagnetic layers do not form anti-ferromagnetic coupling, there is reported an example that materialized a large magneto-resistance effect. That is, while, in one ferromagnetic layer among those which are interposed by the non-magnetic layer, an exchange bias is exerted to pin down magnetization, the other ferromagnetic layer is reversed in its magnetization through an external magnetic field. Thereby changing a relative angle between directions of the magnetization of two ferromagnetic layers disposed being interposed by the non-magnetic layer, a large magneto-resistance effect can be obtained.

Such a type of multi-layer film is called as a spin valve film (refer to Phys. Rev. B., Vol. 45, 806 (1992), J. Appl. Phys., Vol. 69, 4774 (1991) and the like). Although the change rate of the MR of a spin valve film is not so large as that of an artificial lattice film, but it reaches about 10% and is enough large when compared with a conventional AMR film. Further, a spin valve film can be saturated in its magnetization at a low magnetic field, therefore adequate for an MR head. In an MR head which uses such a spin valve film, a large expectation is mounted from a practical point of view.

Now, when an MR element is utilized, for example, in a magnetic head, it is known that magnetostriction constant of an MR film should be made as small as possible. That is, when the magnetostriction constant is large, due to stress during head processing or thermal distribution or temperature variation during operation, Barkhausen noise, popcorn noise, snapcrackle noise can occur. Therefore, magnetostriction constant of a spin valve film is preferred to be $1 \times 10^{-6}$ or less.

A spin valve film is also being discussed to be applied in a magnetic recording device such as a magneto-resistance effect memory (MRAM). Even in an MRAM which uses a spin valve film, Barkhausen noise occurs when the magnetostriction constant is large. This causes an error during playback. Therefore, the magnetostriction constant of a spin valve film is preferable to be set at $1 \times 10^{31\ 6}$ or less.

Besides, it is desirable to employ a material as large as possible in its MR change rate in a spin valve film. A spin valve film utilizing a ferromagnetic material containing Co is known to have a large MR change rate. However, the magnetostriction constant of a Co based magnetic alloy is almost without fail around $1 \times 10^{-6}$ and it is said that the magnetostriction constant is difficult to be reduced below $1 \times 10^{-6}$ with the Co based magnetic alloy only. Although, by adding a small quantity of element to a Co based magnetic alloy, the magnetostriction constant can be reduced, such addition of a small quantity of element induces a decrease of its MR change rate.

When an MR element is employed in a magnetic head, to improve sensitivity of a magnetic head, anisotropic magnetic field $H_K$ and coercive force $H_C$ of an MR film are preferable to be small. When $H_K$ and $H_C$ of an MR film are small, a larger output can be obtained at low magnetic field, and an MR head can be improved in its sensitivity. However, both of $H_K$ and $H_C$ of a Co based magnetic alloy are 10 Oe or more in almost case without fail. Therefore, in a spin valve film utilizing a Co based magnetic alloy, coexistence of a large MR change rate and an excellent soft magnetic property can be materialized only with difficulty.

Further, upon improving sensitivity of an MR head, a spin valve film is required to be increased in its MR change rate. However, only with control of constitutional material or its composition of a spin valve film, further increase of its MR change rate is considered to be very difficult.

SUMMARY OF THE INVENTION

Therefore, an objective of the present invention is to provide, while maintaining a large MR change rate of a spin valve film, a magneto-resistance effect element which enables to satisfy the magnetostriction constant of, for example, $1 \times 10^{-6}$ or less. Another objective of the present invention is to provide a magneto-resistance effect element comprising a spin valve film which concurrently satisfies a large MR change rate and an excellent soft magnetic property. Still another objective of the present invention is to provide a magneto-resistance effect element further improved in its MR change rate of a spin valve film. In addition, it is still another objective to provide a magnetic head comprising such a magneto-resistance effect element.

A magneto-resistance effect element of the present invention comprises a spin valve film including a first magnetic layer, a second magnetic layer, and a non-magnetic layer interposed between the first and the second magnetic layer, and a pair of electrodes which supply a sense current to the spin valve film, wherein at least one magnetic layer of the first and the second magnetic layer is characterized in that the close-packed faces of crystal grains which constitute the magnetic layer are isotropically dispersed.

Another magneto-resistance effect element of the present invention comprises a spin valve film including a first magnetic layer, a second magnetic layer, a non-magnetic layer being interposed between the first magnetic layer and the second magnetic layer, and an under layer which possesses a crystal structure identical as that of the first magnetic layer and on the surface of which the first magnetic layer is formed, wherein a spin valve film is provided with an under layer of a thickness of 2.0 nm or less, and a pair of electrodes which supply a sense current to the spin valve film.

A magnetic head of the present invention is characterized in comprising a lower side magnetic shield layer, an above described magneto-resistance effect element of the present invention formed thereon through a lower side reproducing magnetic gap, and an upper side magnetic shield layer formed on the magneto-resistance effect element through an upper side reproducing magnetic gap.

In the present invention, for at least one magnetic layer of a first and a second magnetic layer (a spin valve magnetic layer), a magnetic layer of which close-packed faces of the crystal grains are isotropically dispersed is employed. Here, a state where the close-packed faces of the crystal grains are isotropically dispersed is a state where, as shown in FIG. 1, the close-packed face CF of each crystal grain (grain) G1, G2, G3 . . . which constitutes a magnetic layer M forms various angles with respect to a surface of the substrate S respectively, and this magnetic layer M can be said to be in no particular orientation state. In other words, at least one magnetic layer among the first and the second magnetic layer is a magnetic layer in which each crystal grain is provided with fluctuation in its orientation tendency (direction of orientation).

The magnitude of the magnetostriction constant of a magnetic material depends on its crystalline direction and its sign also varies in either of plus or minus. In such a material system, by giving a fluctuation in its direction of orientation of each crystal grain, each magnetostriction can be cancelled each other by different magnetostriction due to crystalline orientation. Thereby, a spin valve magnetic layer as a whole can be reduced in its magnetostriction constant.

For example, in a spin valve film which utilizes a Co based magnetic alloy obtainable a large MR change rate, its linear magnetostriction constants $\lambda_{100}$ and $\lambda_{111}$ are different in their sign. Therefore, by giving fluctuation in orientation tendency of each crystal grain which constitutes a spin valve magnetic layer to disperse its crystal face roughly uniformly, $\lambda_{100}$ and $\lambda_{111}$ are can be made to cancel out each other. With such a spin valve magnetic layer, a low magnetostriction can be realized with stability.

Further, a main cause to deteriorate a soft magnetic property of a spin valve film is a crystalline magnetic anisotropy. A crystalline magnetic anisotropy is different depending on its crystal orientation and has in most cases a diad or more symmetry axis. In such a material system, by giving a fluctuation in its orientation tendency of each crystal grain, the crystalline magnetic anisotropy can be cancelled out each other. Thereby, the crystalline magnetic anisotropy of a spin valve magnetic layer as a whole can be reduced. Further, naturally, by heat treating in a magnetic field, an appropriate magnitude of an induced magnetic anisotropy can be given.

As to a coercive force $H_C$ of a spin valve magnetic layer, if the crystal orientation varies with a period of 20 nm or more, since it becomes a pinning site in a Bloch wall, a coercive force $H_C$ tends to increase. Besides, in a crystal grain not greater than 10 nm or less in its grain diameter, if the crystal faces are dispersed in an isotropic manner, potential variation of long period which Bloch wall feels becomes small. Therefore, since the Bloch wall is not pinned down and can move smoothly, the coercive force $H_C$ decreases.

In addition, as to an MR change rate of the spin valve film, it has been considered that, generally, as an orientation tendency decreases, lattice coherency of a crystal grain deteriorates and dislocation increases to reduce a mean free path of spin as a whole, thus the MR change rate also decreases. However, as a result of detailed discussion and many experiments on a relationship between the crystal orientation tendency and the MR change rate of the spin valve film, the present inventors found that the MR change rate rather increases in a no-orientation film. Still further, when a crystal grain (main-grain) is constituted of a plurality of sub-grains (sub-grain), particularly large MR change rate can be obtained.

In another magneto-resistance effect element of the present invention, thickness of an under layer which has an identical crystal structure as that of the spin valve magnetic layer is 2.0 nm or less. By making the thickness of the under layer such very thin as 2.0 nm or less, the close-packed faces of crystal grains constituting it can be dispersed isotropically with reproducibility. In a spin valve magnetic layer formed on a main surface of such an under layer, the close-packed faces of the crystal grains can disperse isotropically with reproducibility. Therefore, low magnetostriction and an excellent soft magnetic property of a spin valve film can be materialized with reproducibility. The thickness of the under layer is preferable to be 1.5 nm or less.

An under layer of the present invention can be given a function as a seed layer which promotes excellent crystal growth of the ferromagnetic layer to be formed thereon, the non-magnetic layer on the surface thereof, the ferromagnetic layer on the non-magnetic layer, and the anti-ferromagnetic layer.

A magnetic head of the present invention can be applied in, for example, a magnetic recording/reproducing head as a reproducing head. The magnetic recording/reproducing head comprises a reproducing head having, for example, an above described magnetic head of the present invention, a lower side magnetic pole which is made common with a lower side magnetic shield layer of the magnetic head, a recording magnetic gap formed on the lower side magnetic pole, an upper side magnetic pole disposed on the recording magnetic gap, and a recording coil for supplying a recording magnetic field to the lower side magnetic pole and the upper side magnetic pole.

Further, a magnetic recording/reproducing head can be mounted on a magnetic recording device such as a magnetic disc unit. The magnetic recording device comprises, for example, a magnetic recording medium and a head slider where signal is written in the magnetic recording medium through magnetic field and the signal is read out through the magnetic field generated from the magnetic recording medium.

DESCRIPTION OF THE PREFERRED EMBODIMENTS

In the following, embodiments for implementing the present invention will be described with reference to the drawings.

Figure 1:
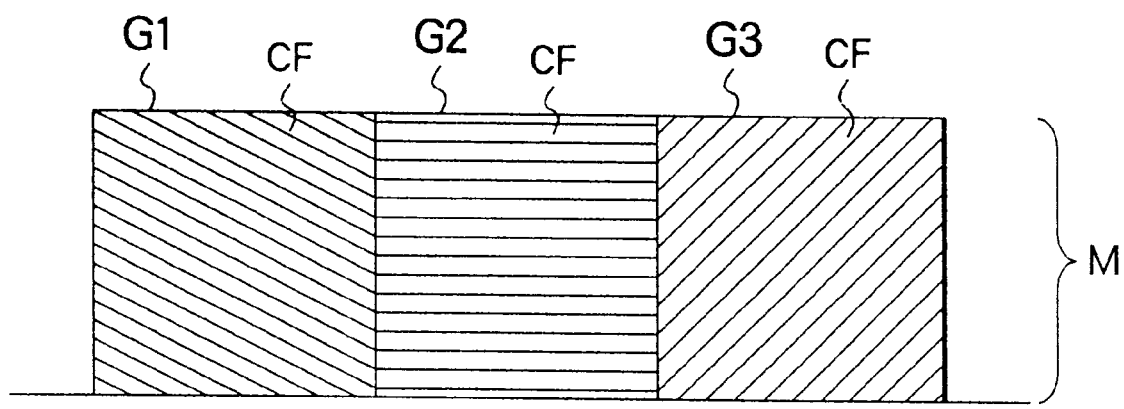
FIG. 1 is a diagram schematically showing a state of a magnetic layer in which crystal close-packed faces are isotropically dispersed.
Figure 2:
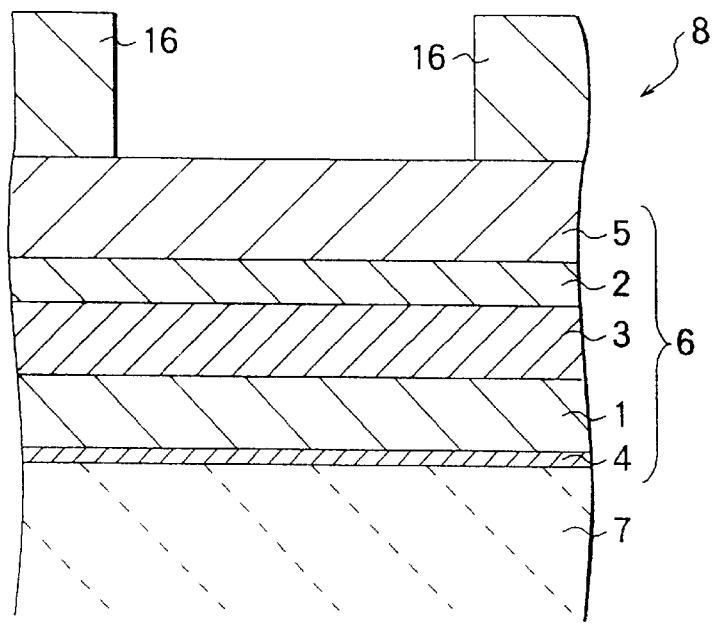
FIG. 2 is a sectional view showing a structure of an essential portion of one embodiment of a magneto-resistance effect element of the present invention.

FIG. 2 is a sectional view showing an essential construction of one embodiment of a magneto-resistance effect element (MR element) of the present invention. In the same figure, numeral 1 is a first magnetic layer, numeral 2 is a second magnetic layer. These the first and the second magnetic layers 1, 2 are stacked through a non-magnetic layer 3. The first and the second magnetic layers 1, 2 are not coupled anti-ferromagnetically to constitute a non-coupled type magnetic multi-layer film. The film thicknesses of the first and second magnetic layer are preferable to be set in the range of from 1 to 30 nm where a large MR change rate is obtained and the occurrence of Barkhausen noise can be suppressed.

The first and the second magnetic layer 1, 2 are constituted of a ferromagnetic material containing Co such as Co alone or a Co alloy. The magnetic layers 1, 2 can be constituted by such as a NiFe alloy. Among them, a Co alloy with which, in particular, a large bulk effect and an interface effect can be obtained, and, with which a large MR change rate can be obtained, can be preferably employed.

In a Co based magnetic alloy such as a CoFe alloy, signs of the linear magnetostriction constants $\lambda_{100}$, $\lambda_{111}$ are different, and both of $\lambda_{100}$ and $\lambda_{111}$ are difficult to make such small as $10^{-7}$ order. Therefore, in a film high in its orientation tendency, the magnetostriction fluctuates due to a subtle decrease of the orientation tendency to be difficult to materialize a magnetostriction of $10^{-7}$ order with stability. Thus, the present invention is particularly effective for a spin valve film which utilizes a Co based magnetic alloy difficult in reduction of its magnetostriction by control of its material composition.

As a Co alloy making up the magnetic layers 1, 2, an alloy obtained by adding one kind or two or more kinds of elements selected from a group of Fe, Ni, Au, Ag, Cu, Pd, Pt, Ir, Rh, Ru, Os, Hf to Co can be used. An addition quantity of the element is preferable to be in the range of from 5 to 50 atomic %, further preferable to be in the range of from 8 to 20 atomic %. This is because, if the addition quantity of the element is too small, the bulk effect can not be increased enough, on the contrary, if the addition quantity of the element is too much, the interface effect is likely to decrease. To obtain a large MR change rate, Fe is particularly preferable among the addition elements.

In addition, even though a ferromagnetic material such as a NiFe alloy can be made low in magnetostriction value by controlling its composition, as will be described in detail later, by giving fluctuation in orientation tendency of crystal grains, the magnetostriction can be made further small in its value. From these, the present invention is also effective in a spin valve film utilizing a NiFe alloy and the like.

Among a first and a second magnetic layer 1, 2, the lower side first magnetic layer 1 is formed on a main surface of an under layer 4. When a Co based magnetic alloy is used for the first magnetic layer 1, the under layer 4 is made up of a metal material having a fcc crystal structure identical with that of the Co based magnetic alloy. As a metal material having a fcc crystal structure, a magnetic metal material such as Ni, NiFe alloy, NiFeCo alloy, or a non-magnetic metal material such as Cu, Au, Ag, Pt and an alloy formed therebetween can be used. The magnetic metal materials having a fcc crystal structure or the non-magnetic metal materials can be alloys in which resistance is heightened by addition of element of such as Ti, V, Cr, Mn, Nb, Mo, Tc, Hf, Ta, W, Re.

Further, even when a NiFe alloy is used in the first magnetic layer, an under layer 4 made up of the magnetic metal material or the non-magnetic metal material having an identical fcc crystal structure can be used.

The added amount of the additional elements referred to in claim 22 is preferable to be 10 at % or less. While heightening of the resistance of the under layer due to added element saturates at 10 at %, if more than 10 at % is added, the added element diffuses to the magnetic layer or the like to reduce the resistance value of the magnetic layer or induce inconvenience to crystallinity of the magnetic layer, or to induce ferromagnetism or anti-ferromagnetism to the non-magnetic layer itself.

The first magnetic layer 1 is a sensor layer (magnetization free layer) in which its direction of magnetization varies according to an external magnetic field. Besides, on the second magnetic layer 2, an anti-ferromagnetic layer 5 consisting of such as IrMn, PtMn, FeMn, NiO is formed. The second magnetic layer 2 is provided with a bias magnetic field from an anti-ferromagnetic layer 5 to pin down its magnetization. The second magnetic layer 2 is a magnetization pinning layer (magnetization pin layer).

As a constitutional material of a non-magnetic layer 3 disposed between the first and the second magnetic layer 1, 2, Cu, Au, Ag, or a paramagnetic alloy containing preceding element and magnetic element, Pd, Pt, and alloy containing them as a main component can be cited. The film thickness of the non-magnetic layer 3 is preferably set at about from 2 to 5 nm. If the film thickness of the non-magnetic layer 3 exceeds 5 nm, enough resistance change sensitivity can not be obtained, and if it is less than 2 nm, exchange coupling between the magnetic layers 1, 2 is difficult to make enough small.

A spin valve film 6 is made up of the above described respective layer. Each layer making up a spin valve film 6 is stacked in sequential manner on a main surface of a substrate 7. With such a spin valve film 6 and a pair of electrodes 16 supplying a sense current to the spin valve film 6, an MR element 8 is made up.

An MR element 8 can further possess a bias magnetic field inputting film consisting of a hard magnetic film or an anti-ferromagnetic film which inputs a bias magnetic field to the first magnetic layer 1 serving as a magnetization free layer. In this case, the bias magnetic field is preferable to have a direction nearly orthogonal to the direction of magnetization of the second magnetic layer 2 which serves as a magnetization pinning layer.

In an MR element having a spin valve film 6, although the magnetization of the second magnetic layer 2 is pinned down, the direction of the magnetization of the first magnetic layer 1 is rotated by an external magnetic field. By thus varying the relative angle of the directions of the magnetization of two magnetic layers 1, 2 disposed pinching the non-magnetic layer 3, the magneto-resistance effect can be obtained.

In an MR element having such a spin valve film 6, at least one member among the first and the second magnetic layers 1, 2, is made up of a magnetic layer in which the close-packed faces of the constituent crystal grains are isotropically dispersed. In this case, it may be well if the close-packed faces of the crystal grains are isotropically dispersed in the first magnetic layer 1 serving as a magnetization free layer. From practical point of view, it is preferable that both of the first and the second magnetic layer 1, 2 are made up of the magnetic layers which crystalline closed-packed faces are dispersed isotropically.

An isotropic dispersion state of the close-packed faces of the crystal grains constituting the magnetic layer 1, 2 can be confirmed from x-ray diffraction peak of the close-packed faces of the crystal grains. For example, when the magnetic layers 1, 2 are formed of a Co based magnetic alloy having the fcc crystal structure, it can be confirmed from the x-ray diffraction peak of (111) face which is the close-packed face of the crystal grain. If the (111) faces are dispersed isotropically, (111) diffraction peak does hardly appear in the x-ray diffraction pattern. The magnetic layers 1, 2 being in a crystalline state can be ascertained with x-ray diffraction or a high resolution section TEM.

An isotropic dispersion state of close-packed faces of the crystal grains can be confirmed by observing a sectional view obtained by a high resolution section TEM. By observing a section with a high resolution section TEM, for a portion where an atomic image can be identified, the direction of the close-packed face can be determined. In that case, whether the close-packed faces are dispersed isotropically or not can be ascertained with a statistical method.

That is, when observed from a certain direction, in some part the atomic image can be observed and, in some other part, the atomic image can not be observed. Then, let us put points on the TEM photograph with a definite spacing. When a lattice image can be observed at one point, the close-packed direction (a direction in which a number of atoms per unit length is most dense) at this point is determined and an angle between that direction and the surface of the substrate can be obtained. The obtained angle is sorted out into one direction among ten directions of each 18° obtained by dividing the angle of from 0° to 180°. Now, put a probability being in a certain angle L as $P_m(L)$. The theoretical probability should be $$P_m(L)=1/100$$

when being isotropically dispersed. Therefore, when a number of points of which orientations can be determined is N, statistic quantity of $\chi^2$ test of goodness-of-fit is expressed by $$\chi^2(N) = \frac{\sum_L \{P_m(L) \cdot N - N/10\}^2}{N/10}. \qquad (1)$$

For example, when the directions were determined for 100 points, since $\chi^2_{0.5}(N)<\chi^2(N)<\chi^2_{0.25}(N)$ and $\chi^2_{0.25}(100)=129.56$ and $\chi^2_{0.5}(100)=99.334$, if the $\chi^2(100)$ value is within these values, it can be said that it is sufficiently probable in having an isotropic dispersion.

That is, from N points where the angle L of the magnetic layers 1, 2 or the under layer 4 can be determined, based on the equation (1), $\chi^2(N)$ value is determined. If the value of $\chi^2(N)$ is more than that of $\chi^2_{0.5}(N)$ and less than that of $\chi^2_{0.25}(N)$ of $\chi^2$ distribution table, the magnetic layers 1, 2 and the under layer 4 of the present invention can be said to be isotropically dispersed. Thereby, an effect of the present invention can be exerted.

The number of measurement points is not necessarily to be 100 points and a method for determining the measurement points can be other one. However, an area to be covered by the measurement should be enough large. It is preferable to measure in a film plane direction an area 10 times and more the total film thickness of the spin valve film 6 and more preferable to measure an area 50 times or more the film thickness. Further, it is desirable to set the spacing of measurement at larger than the total film thickness of the spin valve film 6.

Further, when a section observation is done with a high resolution section TEM, an transmission electron diffraction pattern image can be obtained at the same time. In this case, when the close-packed faces are dispersed isotropically, the obtained Debye-Scherrer ring becomes an image having concentric and uniform intensity. If there is a face having an orientation, the Debye-Scherrer ring has an intensity distribution. For example, when the (111) face is aligned predominantly with respect to the substrate surface, the transmission electron diffraction image of a section has a spots strong in the direction of the orientation axis. Further, when a distribution exists in its orientation axis, the diffraction pattern has an arc like pattern instead of the spots. When being dispersed isotropically, although the Debye-Scherrer ring does not necessarily form a completely uniform image, a diffraction pattern homogeneous for a full circle can be obtained. When Debye-Scherrer ring does not fluctuate in its brightness 5 times or more along its full circle, an excellent property can be obtained. In other words, if the maximum value of the intensity of the observed Debye-Scherrer ring pattern is 5 times or less that of the minimum value, it can be said to be in enough no orientation state. In particular, when the brightness does not fluctuate 2 times or more, a more excellent property can be obtained.

Whether the magnetic layers 1, 2 are in crystalline state or in an amorphous state can be also judged from the transmission electron diffraction pattern. That is, when it is in a crystalline state, the Debye-Scherrer ring becomes concentric, but, when it is in an amorphous state, the ring blurs and forms a hallow pattern. Further, strictly speaking, whether being in an amorphous state or in a micro-crystalline state can be determined by analyzing a radial direction distribution.

In the above described method, it is necessary for an area where the electron beam hits to contain a sufficiently many crystal grains. Therefore, an area to be measured is preferable to be $1\times10^{-2}$ $\mu m^2$ or more.

Further, in the above measurement, the analyzing method is not necessarily restricted to the transmission electron diffraction method, but, the other diffraction method employing such as a reflection high energy electron diffraction (RHEED) can be also employed for analysis. Further, a method employing the above described diffraction pattern is not necessarily restricted to a method that employs an electron beam, but also with a method utilizing x-ray, the identical judgement can be done.

The magnetostriction constants of a magnetic material are different according to their crystalline directions, and, in many cases, their signs can be opposite in plus and minus. In a Co based magnetic alloy such as a CoFe alloy, the signs of its linear magnetostriction constants $\lambda_{100}$, $\lambda_{111}$ are different as mentioned above. In such a material system, when the close-packed faces of the crystal grains of the magnetic layer 1, 2 are dispersed isotropically, respective crystal face, that is, (100) face and (111) face are almost uniformly dispersed. Therefore, $\lambda_{100}$ and $\lambda_{111}$ opposite in their signs are cancelled out each other to result in a small magnetostriction constant as a spin valve film 1, 2 as a whole.

Thus, by utilizing the spin valve magnetic layers 1, 2 in which the orientation tendency of each crystal grain (direction of orientation) is provided with fluctuation, in particular, by utilizing the magnetic layer 1 as a magnetization free layer, a spin valve film 6 can be made low in its magnetization constant in a stable and excellent manner.

Further, by isotropically dispersing the close-packed faces of the crystal grains of the magnetic layer 1, 2, crystalline magnetic anisotropy different according to the crystal directions can be cancelled out each other. Thus, the crystalline magnetic anisotropy as a spin valve magnetic layer as a whole can be reduced. In addition, without question, by executing a heat treatment in a magnetic field, an appropriate induced magnetic anisotropy can be given.

When spin valve magnetic layers 1, 2 have crystal grains of 10 nm or less in their grain diameter, by isotropically dispersing the close-packed faces of the crystal grains, a potential variation of a long period which Bloch wall feels becomes small. Therefore, the Bloch wall can move smoothly without being pinned down. Thus, by isotropically dispersing the close-packed faces of the crystal grains of the spin valve magnetic layers 1, 2, the coercive force $H_C$ can be reduced.

Thus, by reducing the crystalline magnetic anisotropy of the spin valve magnetic layers 1, 2 and by reducing the coercive force $H_C$, the soft magnetic property of the spin valve film 6 can be enhanced. The improvement of the soft magnetic property of the spin valve film 6 contributes greatly in improving the sensitivity of a magnetic head using thereof.

The above described magnetic layers 1, 2 in which the close-packed faces of the crystal grains are isotropically dispersed, in other words, the magnetic layers 1, 2 in which orientation tendency of each crystal grain is provided with fluctuation, can be obtained with reproducibility by isotropically dispersing the close-packed faces of the crystal grains of the under layer 4 which has an identical crystal structure with the magnetic layers 1, 2.

Since each crystal grain of the first magnetic layer 1 grows according to each crystal grain of the under layer 4, if the close-packed faces of the crystal grains of the under layer 4 are dispersed isotropically, the close-packed faces of the crystal grains of the first magnetic layer 1 disperse isotropically in an identical manner. Therefore, when each contacting crystal grain is viewed separately, the close-packed faces of the crystal grains of the first magnetic layer 1 are preferable to grow in nearly parallel with respect to the close-packed faces of the crystal grains of the under layer 4.

Thus, since the first magnetic layer 1 accepts a dispersion state of the close-packed faces of the crystal grains of the under layer 4, by dispersing isotropically the close-packed faces of the crystal grains of the under layer 4, the close-packed faces of the crystal grains of the first magnetic layer 1 can be dispersed isotropically with reproducibility. Further, by forming films of the non-magnetic layer 3 and a second magnetic layer 2 in turn on the first magnetic layer 1, the close-packed faces of the crystal grains thereof also can be dispersed isotropically. According to such a spin valve film 6, excellent low magnetostriction or soft magnetic property, further a large MR change rate can be materialized with reproducibility.

In order to disperse isotropically the close-packed faces of the crystal grains constituting the under layer 4, it may be as well to make such thin its thickness as 2.0 nm or less, for example. That is, when the film thickness of the under layer is such thin as 2.0 nm or less (not including 0 nm), the close-packed faces of the crystal grains can be dispersed isotropically in an excellent manner. When forming film with a conventional sputtering method, if the film thickness of the under layer 4 exceeds 2.0 nm, the orientation tendency of the crystal grains becomes remarkably strong during film growing step, thus it becomes difficult to obtain an isotropically dispersed film of the close-packed faces. When the thickness of the under layer 4 is made 1.5 nm or less, the crystal's orientation tendency in particular can be decreased and the close-packed faces can be isotropically dispersed with reproducibility. The thickness of the under layer 4 is desirable particularly to be 1.5 nm or less.

However, by controlling the conditions during film formation, even if the film thickness of the under layer 4 is 2.0 nm or more, the isotropic dispersion of the close-packed faces of the crystal grains can be attained. For example, when a bias sputtering method is employed for formation of the under layer 4, even when the film thickness exceeds 2.0 nm, an isotropically dispersed film of the close-packed faces of the crystal grains can be obtained. Even when such a film formation method is applied, if the film thickness of the under layer 4 is too thick, since the orientation tendency of the crystal grain becomes strong, the thickness of the under layer 4 is set at 5 nm or less.

Figure 3:
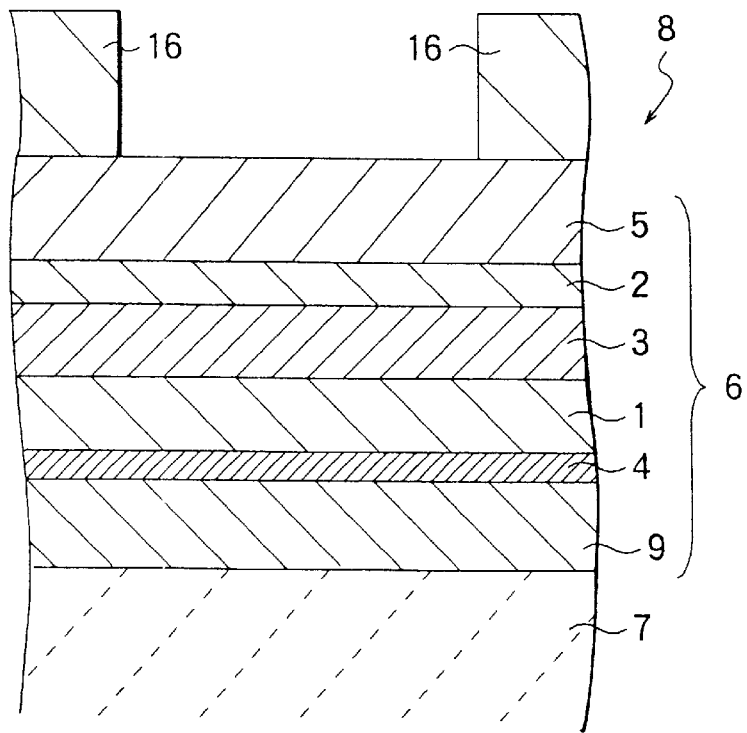
FIG. 3 is a sectional view showing one modification example of a magneto-resistance effect element shown in FIG. 2.

As a preventing method of the orientation of the crystal grains of the under layer 4, as shown in FIG. 3, it is effective to dispose an amorphous magnetic material layer 9 adjacent to the under layer as a second under layer. As an amorphous magnetic material layer 9, an amorphous soft magnetic material such as CoNb, CoZr, CoZrNb, CoB, CoFeB, CoFeBSi can be used preferably.

On such an amorphous magnetic material layer 9, by forming the first under layer 4 identical in its crystal structure as that of the magnetic layers 1, 2, the close-packed faces of the crystal grains of the under layer 4 can be isotropically dispersed with further reproducibility. The amorphous magnetic material layer 9 also contributes to improving soft magnetic property of a spin valve film 6. In addition, since the amorphous magnetic material layer 9 is high in its resistance, decrease of the MR change rate due to a shunt current of the sense current can be suppressed.

For the second under layer, instead of the above described amorphous magnetic material layer 9, a crystalline material large in its mismatch of the lattice constant from the first under layer 4 can be used. As such a crystalline material, such materials obtained by adding Ru, Os, Rh, In, Pd, Pt, Ag, Au to a NiFe alloy can be cited.

Figure 4:
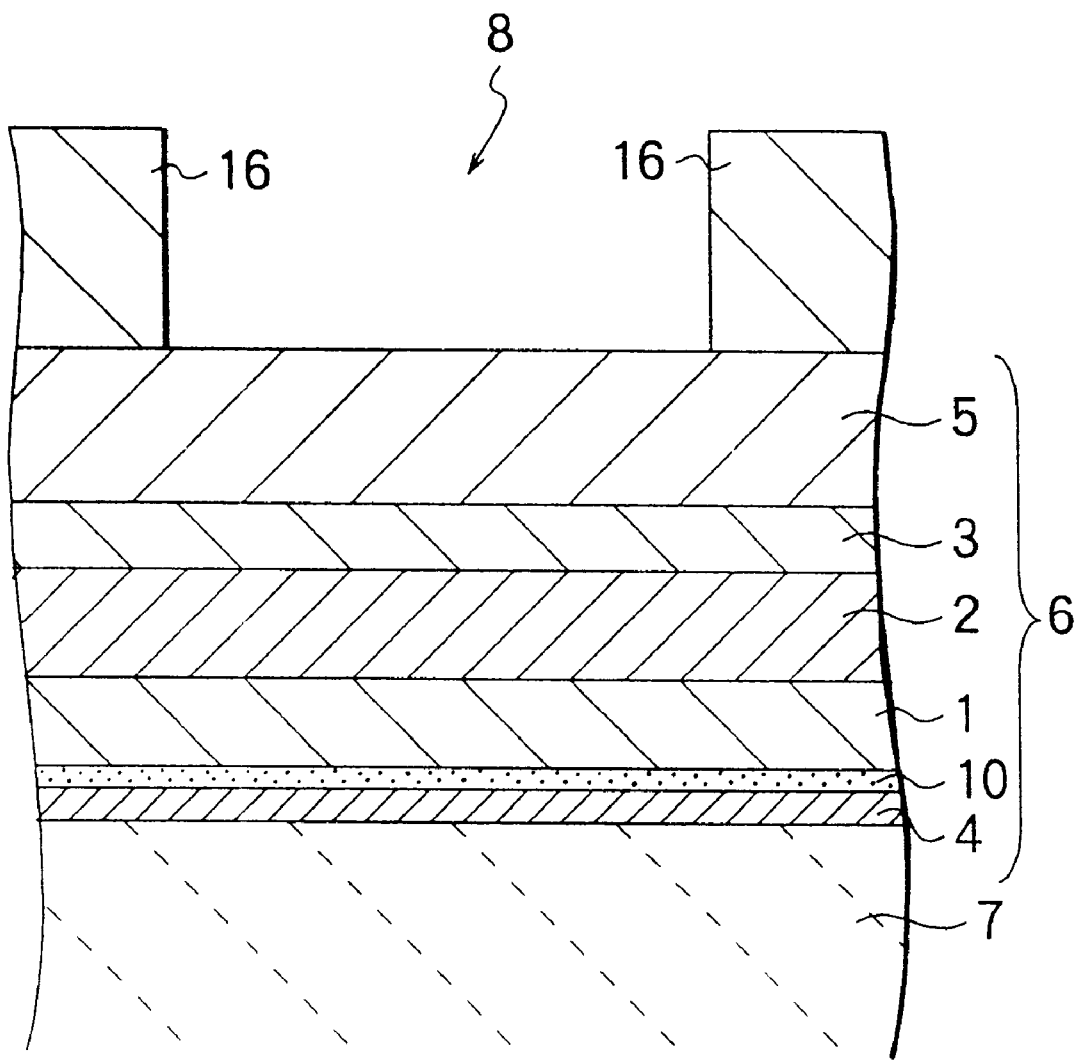
FIG. 4 is a sectional view showing another modification example of a magneto-resistance effect element shown in FIG. 2.

Further, when, while preventing the orientation of the crystal grains of the first magnetic layer 1, the close-packed faces of the crystal grains are dispersed isotropically, as shown in FIG. 4, at the interface between the under layer 4 and the first magnetic layer 1, a compound layer 10 comprising at least one kind compound selected from an oxide, a nitride, and a fluoride as a main component can be effectively disposed. By interposing such a compound layer 10, the under layer 4 and the first magnetic layer 1 are discontinued with respect to their crystal structure. Therefore, the close-packed faces of the crystal grains of the first magnetic layer 1 can be dispersed isotropically. Since, if the thickness of the compound layer 10 is too thick, it is likely to lose the effect of the under layer 4, the thickness of the compound layer 10 is preferably set at 2 nm or less.

The above described compound layer 10 also works as a barrier layer for preventing thermal diffusion of atoms. Therefore, the mutual diffusion of atoms between the under layer 4 and the first magnetic layer 1 can be suppressed during heat treatment operation, thus heat resistance of the spin valve film 6 can be enhanced. That is to say, by forming a compound layer 10, deterioration of the magnetoresistance effect due to thermal diffusion can be suppressed and stability of the MR element can be improved.

As a constituent material of the compound layer 10, an oxide, a nitride, a boride, a fluoride can be employed. They can be used without restricting in single, but also can be in a mixture or a complex compound. Among these, an auto-oxidation film, a surface-oxidation film, a passivation film and the like particularly easy in formation can be preferably used. The compound layer 10, after formation of the under layer 4, can be formed by exposing once its surface to the air, or by exposing to an atmosphere containing oxygen, nitrogen, fluorine, and boron. Further, it can be formed with an ion implantation method or by exposing to plasma.

The compound layer 10 can be deviated from its strict stoichiometrical composition. In addition, there is no need of forming a fine crystal lattice and it can be an amorphous state. Still further, the morphology of the compound layer 10 is not necessarily required to cover the surface of the under layer 4 uniformly but can be formed in a discrete state such as a state where pin holes exist, or a state where the compound exists island-like.

Figure 5:
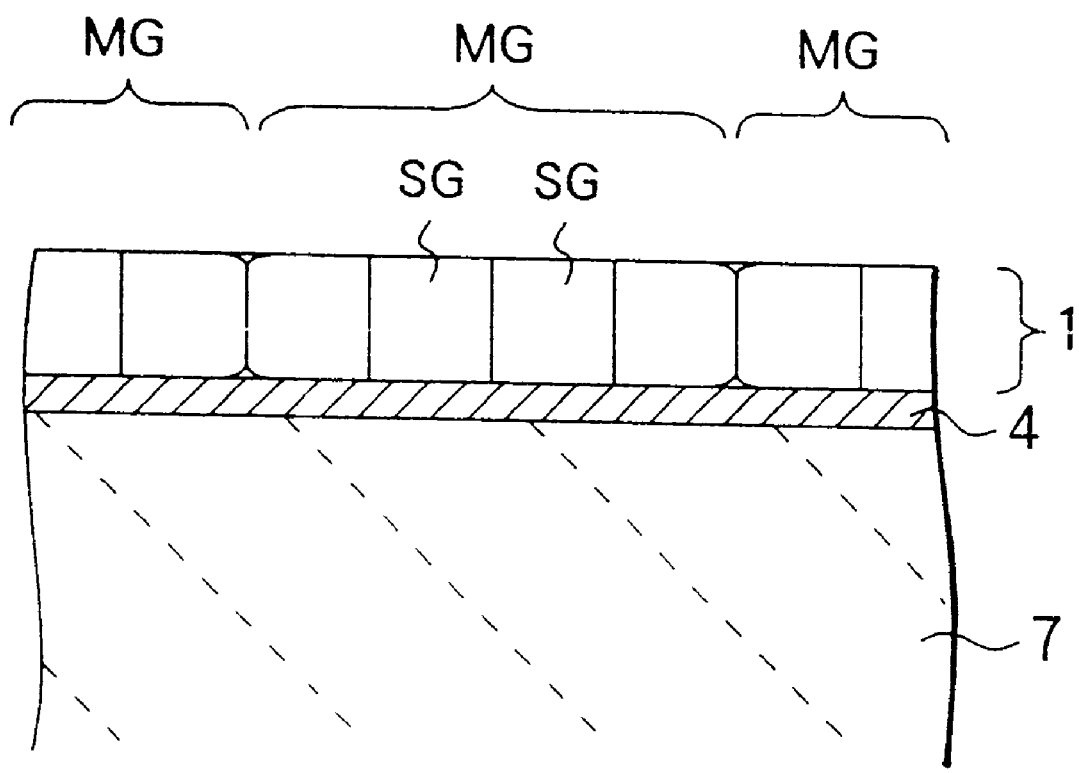
FIG. 5 is a diagram schematically showing one example of a micro-crystalline structure of a spin valve magnetic layer in a magneto-resistance effect element of the present invention.

Further, by applying the under layer 4 the close-packed faces of the crystal grains of which are isotropically dispersed, the first magnetic layer 1 having a sub-grain structure can be obtained relatively easily. The sub-grain structure is, as shown in FIG. 5, a structure where a plurality of sub-grains SG exist in one main-grain MG. By forming the first magnetic layer 1 on the under layer 4 which is in no-orientation state and relatively large in its internal stress, a sub-grain structure can be obtained relatively easily.

Distinction between a sub-grain SG and a main grain MG can be determined through observation of a section TEM pattern. That is, when section TEM observation is executed, since, at the grain boundary of the main grains, a relatively large unevenness occurs, as shown in FIG. 5, on the surface of the spin valve film 6, an unevenness corresponding to the size of the main grain occurs. In addition, since an angle which the directions of the close-packed atomic faces form between the main grains MG generally have an angle of 10° or more, the contrast of the grain boundary is strong and clear.

On the contrary, the sub-grains SG exist with periods shorter than the unevenness of the surface and in the range clearly discernable as one main grain MG from the unevenness of the surface. Further, an angle which the directions of the close-packed atomic faces form between sub-grains SG is such small as 10° or less, therefore, when compared with the grain boundary of the main grains MG, the contrast is weak and not clear.

From these, in a spin valve film which does not have a sub-grain structure, the unevenness of the surface and the grain boundary correspond relatively clearly, the distinction of the crystal grains is clear. On the contrary, in a spin valve film which has the sub-grain structure, the unevenness of the surface and the grain boundary do not correspond clearly, the distinction of the crystal grains is not clear. Now, when such an observation is executed, the sample is required to be processed as thin as possible. It is desirable to observe a place of which thickness is thinner than the total thickness of a spin valve film (the film thickness from the under layer to the protective layer).

Further, when, by reducing a diameter of an electron beam to a degree of the size of a main grain with a nano-beam diffraction method (micro-beam diffraction method), an electron diffraction pattern is observed on one main grain, in a spin valve film which does not have a sub-grain structure, point-like diffraction spots can be observed and thereby it can be judged to be a single crystal. On the contrary, in a spin valve film which has a sub-grain structure, a diffraction pattern obtained by superposing diffraction patterns from a plurality of single crystals is observed.

Although an MR change rate of a spin valve film 6 has been generally considered to decrease as the orientation tendency decreases, the MR change rate rather increases when the spin valve magnetic layers 1, 2 are used in their no-orientation state. Further, when a spin valve magnetic layers 1, 2 have such a sub-grain structure as described above, a particularly large MR change rate can be obtained.

Although the sub-grain structure is not necessarily required to be observed in all main grains, it is dewsirable for more than 50% of main grains to have sub-grains. In that case, an MR change rate increases. Further, the sub-grains are desirable to exist even after annealing at the temperature range of from 200° C. to 400° C. is executed for from 1 to 10 hours. In a device morphology such as a head or an MRAM, it is desirable that the sub-grain exists.

In order to obtain a large MR change rate, the sub-grain structure of the spin valve magnetic layers 1, 2 is preferred to have a larger average number of sub-grains SG within in its film plane direction than in the perpendicular direction to the film plane. That is, the sub-grains SG are, as shown in FIG. 5, preferable to exist so as to align in the film plane direction. In addition, the average grain diameters of the spin valve magnetic layers 1, 2 are preferable to be 20 nm or less as an average grain diameter of the main grains MG. If the average crystal grain diameter of the main grains MG exceeds 20 nm, since the crystalline magnetic anisotropy of the respective crystal grain can not be averaged out to appear, $H_K$ and $H_C$ become prone to be large.

The MR element of each embodiment above described can be used as, for example, an MR element portion of a reproducing MR head of a magnetic recording/reproducing device. Further, without restricting to the MR head, it can be also used in an MRAM and the like.

Figure 6:
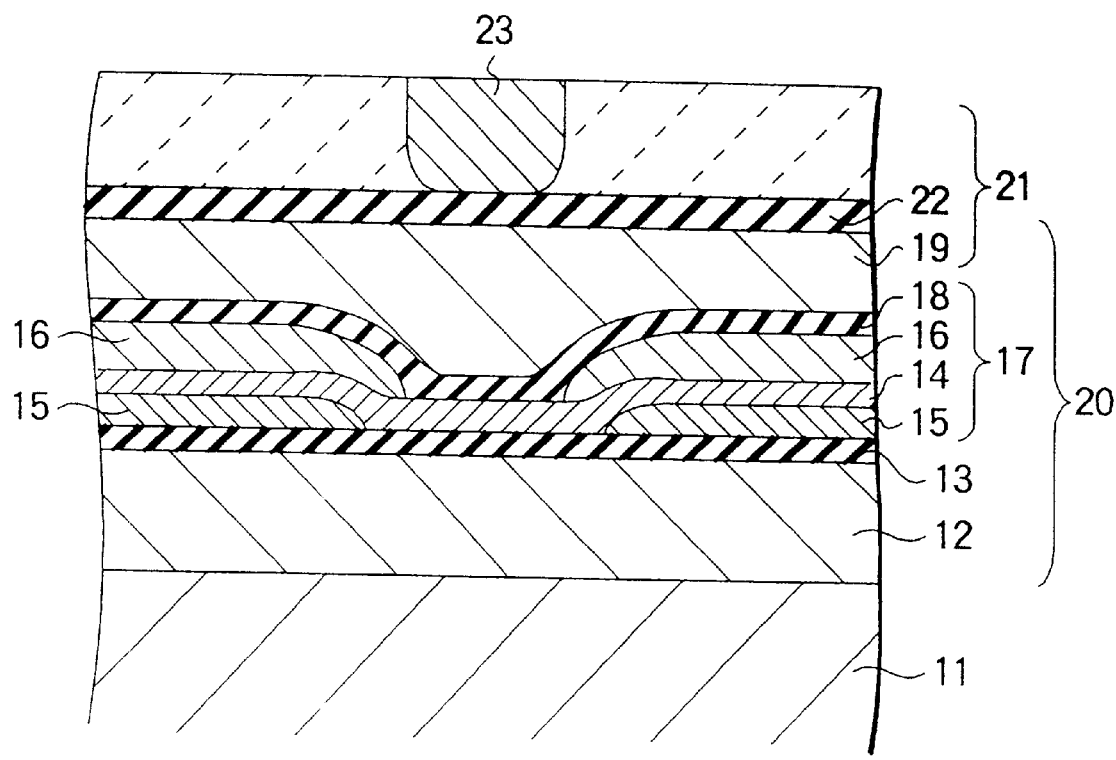
FIG. 6 is a sectional view showing one example of a constitution of a magnetic recording/reproducing separation type head in which a magneto-resistance effect element of the present invention is used in a reproducing head portion.

FIG. 6 is a diagram showing an example of a structure of a magnetic recording/reproducing separation type head in which the MR head of the above described embodiment is applied in a reproducing portion. Here, in a magnetic recording/reproducing separation type head in which a recording head portion is stacked on the reproducing head portion, the MR element of the reproducing portion is placed under stress by stacking the recording head portion thereon or thereunder. Since this stress increases the magnetostriction constant, the present invention exerts an excellent effect even in a magnetic recording/reproducing separation type head.

In FIG. 6, the numeral 11 shows a substrate, and, for the substrate 11, an $Al_2O_3$/TiC substrate having an $Al_2O_3$ layer can be used. On one main surface of the substrate 11, a lower side magnetic shield layer 12 consisting of a soft magnetic material such as a NiFe alloy, an FeSiAl alloy, an amorphous CoZrNb alloy is formed. On the lower side magnetic shield layer 12, the spin valve film (spin valve GMR film) 14 shown in the above described embodiment is formed through a lower side reproducing magnetic gap 13 consisting of a non-magnetic insulation material such as $AlO_X$.

Between the spin valve GMR film 14 and the lower side reproducing magnetic gap 13, bias magnetic field inputting films 15, 15, which input the bias magnetic field to the spin valve GMR film 14, are respectively disposed outside both edge portions of the reproducing track of the spin valve GMR film 14. On the spin valve GMR film 14, a pair of electrodes 16 consisting of such as Cu, Au, Zr, Ta are formed, and the pair of electrodes 16 supply a sense current to the spin valve GMR film 14. These member of a spin valve GMR film 14, a bias magnetic field inputting film 15 and a pair of electrodes 16 constitute a GMR element portion 17.

On the GMR element portion 17, through an upper side reproducing magnetic gap 18 consisting of a non-magnetic insulation material identical with the lower side reproducing magnetic gap 13, an upper side magnetic shield layer 19 consisting of a soft magnetic material identical with the lower side magnetic shield layer 12 is formed. With these constituent elements, a shield type GMR head 20 as a reproducing head portion is constituted.

On the shield type GMR head 20, a thin film magnetic head 21 is formed as a recording head portion. A lower side recording magnetic pole of the thin film magnetic head 21 is formed of a magnetic layer identical with the upper side magnetic shield layer 19. That is, the upper side magnetic shield layer 19 of the shield type MR head 20 concurrently serves as a lower side recording magnetic pole of the thin film magnetic head 21. On the lower side recording magnetic pole 19 concurrently serving as the upper side magnetic shield layer, a recording magnetic gap 22 consisting of a non-magnetic insulation material such as $AlO_X$ and an upper side recording magnetic pole 23 are formed in sequential manner to constitute a thin film magnetic head 21 as a recording head portion.

Figure 7:
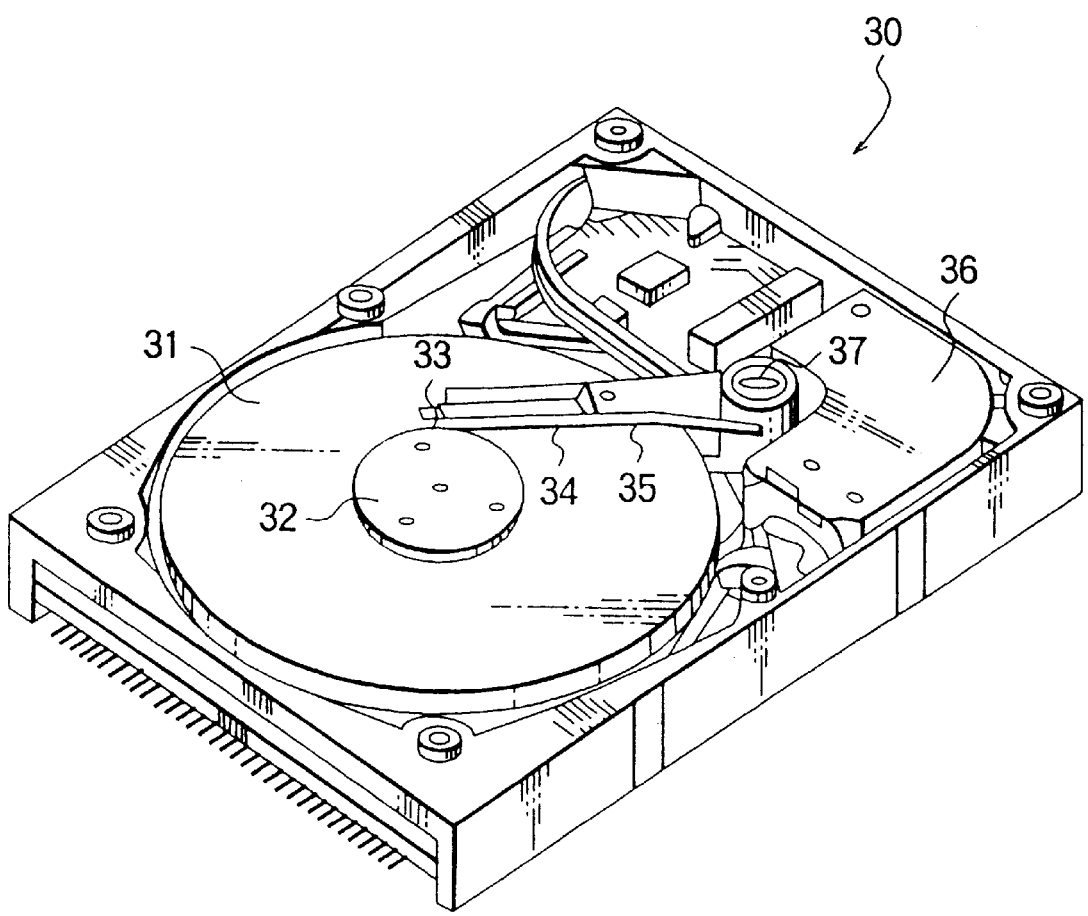
FIG. 7 is a perspective view showing one example of a constitution of a magnetic disc unit using a magnetic head of the present invention.

The above described magnetic recording/reproducing head is assembled in a head slider. A head slider possessing a magnetic recording/reproducing head is mounted in, for example, a magnetic disc unit shown in FIG. 7. FIG. 7 shows a rough structure of a magnetic disc unit 30 employing a rotary actuator.

A magnetic disc 31 is assembled to a spindle 32 and is rotated by a motor (not shown) responding to a control signal from a drive unit controller (not shown). A head slider 33 recording/reproducing information while floating above the magnetic disc 31 is attached at a tip end of a thin film like suspension 34.

When the magnetic disc 31 rotates, an air bearing surface (ABS) of the head slider 33 is held with a predetermined floating quantity d (from 0 to not more than 100 nm) from the surface of the magnetic disc 31. The head slider 33 possesses a magnetic recording/reproducing head of the above described embodiment.

The suspension 34 is connected to one edge of an actuator arm 35 having a bobbin portion and the like holding a not shown driving coil. At the other edge of the actuator arm 35, a voice coil motor 36 which is one kind of a linear motor is disposed. The voice coil motor 36 is formed of a not shown driving coil, which is wound up to the bobbin portion of the actuator arm 35, and a magnetic circuit consisting of a permanent magnet and a yoke oppositely disposed each other so as to be interposed by the driving coil.

The actuator arm 35 is held by not shown ball bearings disposed at two places above and below the fixed axis 37 and can rotate and slide freely by the voice coil motor 36.

Figure 8:
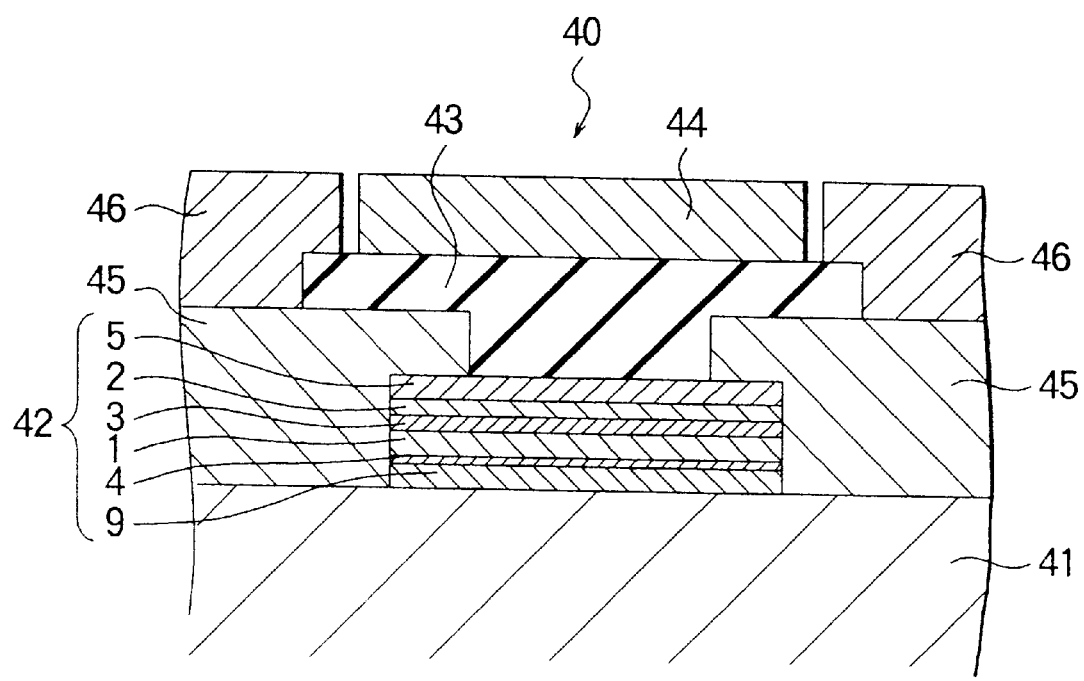
FIG. 8 is a sectional view showing one example of a constitution of an MRAM using a magneto-resistance effect element of the present invention.

FIG. 8 is a diagram showing one example of a structure of an MRAM in which an MR element of the above described embodiment is applied.

An MRAM 40 shown in the figure has a spin valve GMR film 42 formed on a substrate 41 such as a glass substrate or a Si substrate. The spin valve GMR film 42 is formed of a spin valve film shown in the above described embodiment and has an amorphous magnetic material layer 9, an under layer 4, a first magnetic layer 1, a non-magnetic layer 3, a first magnetic layer 1, a non-magnetic layer 3, a second magnetic layer 2 and an anti-ferromagnetic layer 5 formed in a sequential manner from the substrate 31 side.

On the above portion of the spin valve GMR film 42, a writing electrode 44 is disposed through an insulation layer 43. In addition, on both edge portions of the spin valve GMR film 42, a pair of read electrodes 45 consisting of such as Au are disposed. In the figure, numeral 46 show complementary electrodes.

Next, some specific examples of the present invention and the evaluated data thereof will be described.

EMBODIMENT 1

First of all, as shown in FIG. 3, on a thermally oxidized Si substrate 7, a magnetic multi-layer film of CoZrNb (5 nm) 9/NiFe (dnm) 4/CoFe (3 nm) 1/Cu (3 nm) 3/CoFe(2 nm) 2/IrMn (8 nm) 5/Ta (5 nm) structure is formed in films by a sputtering method. This magnetic multi-layer film is patterned to produce an MR element.

Here, after $NiFe_4$ is formed in film, the front surface of this $NiFe_4$ is exposed to oxygen. Thereby, a thin oxidized layer is formed but the film thickness d of the under layer 4 is obtained by subtracting the thickness of this oxidized layer.

Figure 9:
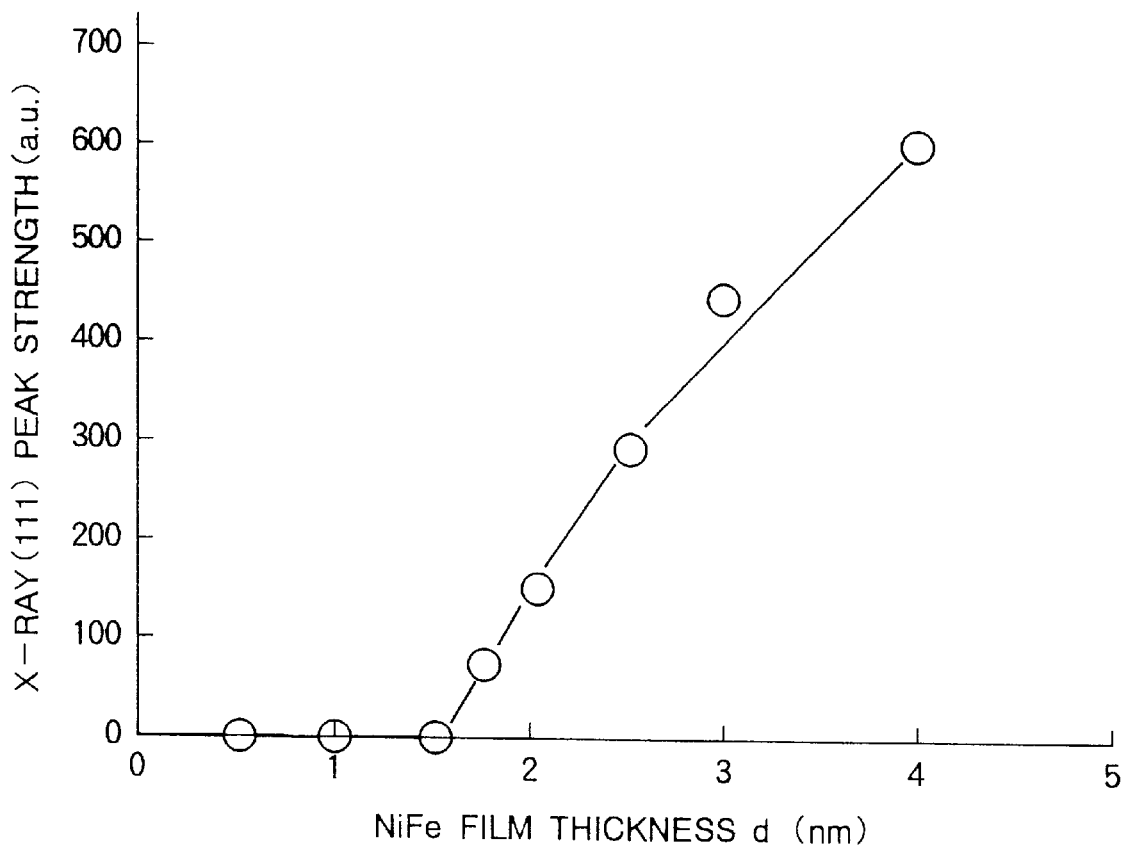
FIG. 9 is a diagram showing a relationship between film thickness of a NiFe under layer and its (111) peak strength obtained by x-ray diffractometry in the Embodiment 1 of the present invention.

In this case, a plurality of samples are prepared by varying the film thickness d of the under layer 4 between from 0.5 nm to 4 nm, wherein the under layer 4 has a fcc crystal structure consisting of a NiFe alloy. Here, Ta is formed as a protective film. With the respective sample, the (111) diffraction peak of the NiFe alloy film as an under layer 4 is observed with an X-ray θ–2θ diffraction method. The results are shown in FIG. 9. The peak intensity decreases as the decrease of the film thickness and no peak is observed at 1.5 nm or less.

In addition, when orientation tendency is confirmed by a high resolution section TEM method, it is found that, in samples the film thickness of a NiFe alloy film of which are large, the (111) face, which is a close-packed face of a crystal, is aligned predominantly with respect to the surface of the substrate. On the contrary, in samples which film thickness of a NiFe alloy film is 1.5 nm or less, it is confirmed that the (111) face of each grain is dispersed nearly uniformly.

Next, (111) diffraction peak of a CoFe alloy film formed on a NiFe alloy film as a magnetic layer 1 is observed in an identical manner. According to the results, in samples which film thickness of a NiFe alloy film is 1.5 nm or less, as identical as in the case of the NiFe alloy film, the (111) peak of the CoFe alloy film can not be observed completely. Further, when the crystalline orientation tendency is confirmed with help of a high resolution section TEM method, it is ascertained that, in samples where the film thickness of a NiFe alloy film is 1.5 nm or less, the (111) faces of the crystal grains of the CoFe alloy film are dispersed isotropically.

Further, a CoFe alloy film of which film thickness of the under layer is 1 nm is examined of the direction of the (111) faces of 100 crystal grains with a high resolution section TEM, based on the result, $\chi^2$ (100) value is calculated. The value of $\chi^2$ (100) was 122. That is, the $\chi^2$ (100) value according to measurement of the present embodiment was more than $\chi^2_{0.5}$ (100) value (=99.334) and less than $\chi^2_{0.25}$ (100) value (=129.56). Samples which have film thickness of the under layer of 1.5 nm or less had nearly identical value. From these results, it is confirmed that, in the CoFe alloy film of the embodiments, the (111) faces are dispersed isotropically.

Figure 10:
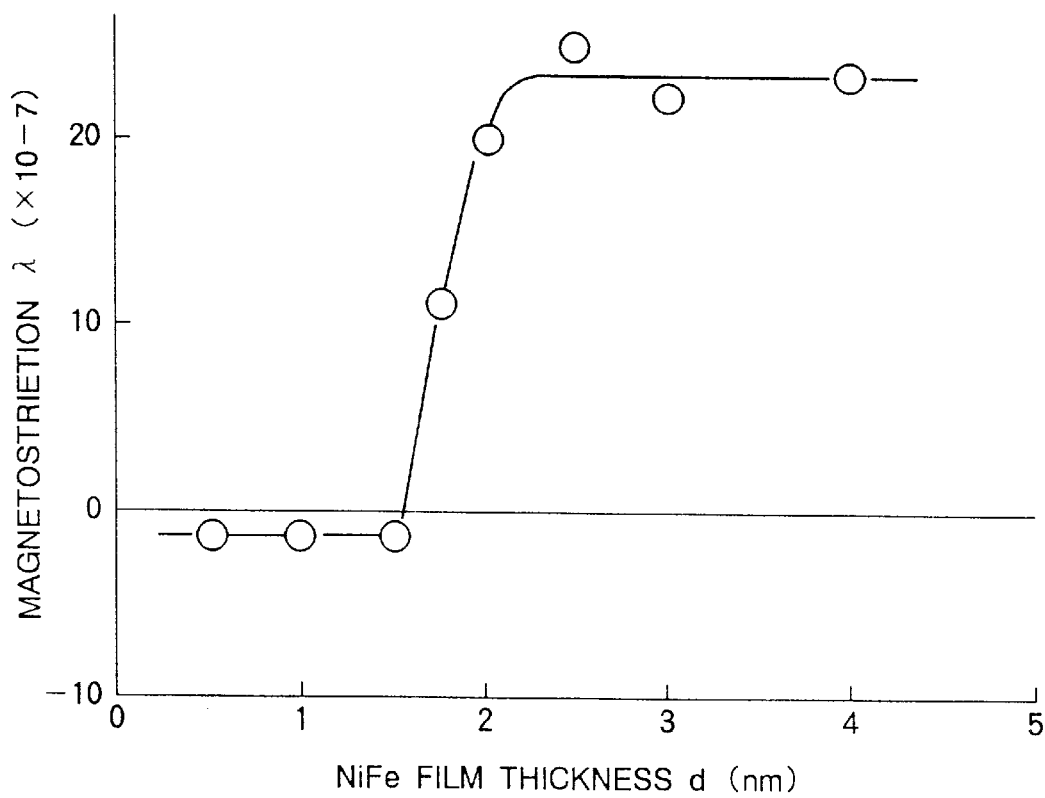
FIG. 10 is a diagram showing a relationship between film thickness of a NiFe under layer and magnetostriction of a spin valve film containing thereof in the Embodiment 1 of the present invention.

Result of magnetostriction constant obtained by measuring each sample is shown in FIG. 10. Although, in the case where the film thickness of the NiFe alloy film is 2.5 nm or more, the magnetostriction constant is $20 \times 10^{-7}$ or more, in the case where the film thickness d of the NiFe alloy film is 1.5 nm or less, it is confirmed that all samples have such a low magnetostriction constant as $-2 \times 10^{-7}$.

Further, each sample is measured of its magnetostriction constant after annealing at 543 K for 100 hour. It is found that, even after this annealing treatment, each sample according to the embodiment where the film thickness of the NiFe alloy film is 1.5 nm or less does hardly vary in its magnetostriction constant and is excellent in its heat resistance.

Figure 11:
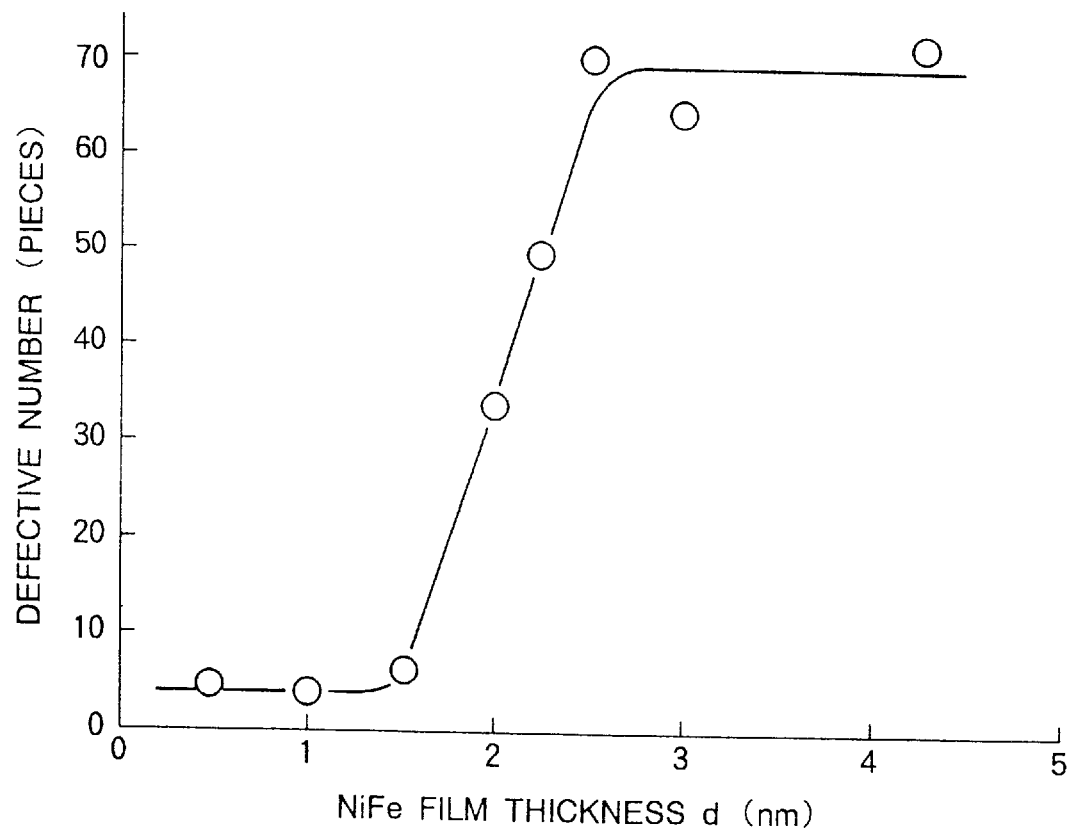
FIG. 11 is a diagram showing a relationship between thickness of a NiFe under layer and number of defective magnetic head in which a spin valve film containing it is used in Embodiment 1 of the present invention.

An MR head is manufactured experimentally with the above described respective MR element. MR heads are manufactured on an $Al_2O_3$/TiC substrate of 3 inch diameter and 800 pieces of MR heads are obtained from one substrate. The manufactured respective MR head is assembled in a real disc drive unit and a number of the head in which Barkhausen noise occurs is confirmed. The result is shown in FIG. 11.

In an MR head where an MR element of which film thickness d of the NiFe alloy film is 1.5 nm or less is used, the defective number is such low as 5 pieces, thus about 1% of the percent defective is obtained. On the contrary, among MR heads using an MR element of which film thickness of the NiFe alloy film is 2.5 nm or more, Barkhausen noise is observed in from 60 to 70 pieces of samples, the percent defective is such high as 10%.

From the above described embodiments and the comparative examples, by controlling the film thickness of the NiFe alloy film as an under layer 4 at 1.5 nm or less, the close-packed faces ((111) face) of the crystal grains which constitute a spin valve magnetic layer can be dispersed isotropically. It is found that, thereby, the magnetostriction constant of the spin valve film can be reduced such low as about $1 \times 10^{-6}$. And, by utilizing a spin valve film of such a low magnetostriction constant, the defect incidence, due to Barkhausen noise, of the MR heads using them can be remarkably reduced.

EMBODIMENT 2

On a thermally oxidized Si substrate 7, a magnetic multi-layer film of Ta(5 nm) /Cu(1 nm) /CoFe(3 nm) /Cu(3 nm) /CoFe(2 nm) /IrMn(8 nm) /Ta(5 nm) structure is formed by a bias sputtering method. By patterning this magnetic multi-layer film, an MR element is manufactured.

With the sample of the embodiment 2, the orientation tendency of the crystal grains of the Cu film as an under layer and the CoFe film as a first magnetic layer is confirmed with a high resolution section TEM method. For each film, the direction of the (111) face is observed on 100 points with a high resolution section TEM and the $\chi^2$ (100) value is calculated based on the result. According to the result, the $\chi^2$ (100) value of the Cu film was 110 and the $\chi^2$ (100) value of the CoFe film was 115. From these results, both the Cu film as an under layer and the CoFe film as a first magnetic layer were confirmed to be dispersed isotropically in their (111) face.

From a high resolution section TEM photograph, it is confirmed that the CoFe film as a first magnetic layer, as shown in FIG. 5, has a sub-grain structure in which a plurality of sub-grains SG exist in one main grain MG.

The magnetostriction constant of the sample of embodiment 2 is confirmed to be such low as $2 \times 10^{-7}$. Further, the magnetostriction constant is measured after annealing at 543 K and for 100 hour. Even after this annealing, the magnetostriction constant did hardly change and the heat resistance was also excellent.

Further, the soft magnetic property and the MR change rate were measured of the samples of embodiment 2. According to the results, 10% value of the MR change rate was able to obtain. In addition, anneal heat resistance of the MR film was also improved, thus, even after annealing at 543 K and for 1 hour, 9% value of the MR change rate was obtained. Further, the $H_K$ value was 5 Oe and $H_C$ value in an easy axis direction such low as 3 Oe was obtained.

EMBODIMENT 3

On a thermally oxidized Si substrate, a magnetic multi-layered film of

Ta(5 nm)/Ag(2 nm)/CoFe(3 nm)/Cu(3 nm)/CoFe(2 nm)/IrMn(8 nm)/Ta(5 nm)

structure is formed in film with an ion-beam sputtering method. During film formation, an assist by an Ar ion-beam is employed. This magnetic multi-layered film is patterned to produce an MR element.

With the sample of this embodiment 3, the orientation tendency of the crystal grains is confirmed with a high resolution section TEM method. As the result, it is confirmed that, in one grain, almost all crystal faces are aligned from the seed, Ag, layer to the IrMn layer. The Ta layer is confirmed to be amorphous. Thereafter, by taking an electron beam diffraction pattern, it is confirmed that the Debye-Scherrer ring is obtained in a pattern concentric, almost equal in its intensity, and isotropically dispersed of the (111) face through all film thickness. Further, it is also confirmed that the Debye-Scherrer ring becomes sharp and concentric and be in a crystalline state.

It is confirmed that the sample of this embodiment 3 is such low as $1 \times 10^{-7}$ in its magnetostriction constant. Further, after annealing the sample at 543 K for 100 hour, the magnetostriction constant thereafter is measured. Even after this annealing treatment, the magnetostriction constant does hardly change to be excellent in its heat resistance.

Further, the soft magnetic property and the MR change rate of the sample of this embodiment 3 are investigated. As the result, the change rate of the MR is found to be 11%. In addition, the heat resistance of the MR film during annealing is found to be improved to be as large as 10% in its MR change rate even after annealing at 543 K for 1 hour. Further, a small $H_K$ as 5 Oe and a small Hc of the easy axis direction as 3 Oe can be obtained.

Even when an MR element of the present invention is employed in an MRAM, by making the spin valve film low in its magnetostriction, such effects as that occurrence of Barkhausen noise can be reduced and read error can be reduced can be obtained.

As explained above, according to a magneto-resistance effect element of the present invention, while maintaining a large magneto-resistance effect, such low magnetostriction as $1 \times 10^{-6}$ or less can be obtained with reproducibility. Further, an excellent soft magnetic property and a large MR change rate can be obtained. When such a magneto-resistance effect element is applied in, for example, a magnetic head, noise occurrence such as Barkhausen noise can be suppressed effectively.

What is claimed is:

1. A magneto-resistance effect element, comprising:
    an under layer having a crystal structure, wherein close-packed faces of crystal grains which constitute the under layer are isotopically dispersed;
    a spin valve film including
        a first magnetic layer formed on the under layer, wherein close-packed faces of crystal grains which constitute the first magnetic layer are isotopically dispersed,
        a second magnetic layer, and
        a non-magnetic layer interposed between the first and the second magnetic layer; and
    a pair of electrodes supplying a sense current to the spin valve film.

2. The magneto-resistance effect element as set forth in claim 1:
    wherein the under layer has a thickness of 5 nm or less.

3. The magneto-resistance effect element as set forth in claim 1:
    wherein the under layer has a thickness of 1.5 nm or less.

4. The magneto-resistance effect element as set forth in claim 1:
    wherein the under layer is formed of a magnetic metal material, and the magneto-resistance effect element has an amorphous magnetic layer disposed adjacent to the under layer.

5. The magneto-resistance effect element as set forth in claim 1:
    wherein the under layer is formed of a non-magnetic material.

6. The magneto-resistance effect element as set forth in claim 5:
    wherein the under layer includes at least one kind selected from Cu, Au, Ag, Pt and alloys thereof.

7. The magneto-resistance effect element as set forth in claim 6:
    wherein the under layer is disposed on a layer comprising material A selected from Cr, Ti, Ta, W, Nb, Mo, and the layer comprising material A selected from Cr, Ti, Ta, W, Nb, Mo is disposed on an amorphous insulation material.

8. The magneto-resistance effect element as set forth in claim 1, further comprising:
    a compound layer disposed at an interface between the under layer and the first magnetic layer, wherein the compound layer has one kind of compound selected from an oxide, a nitride, a boride and a fluoride as a main component.

9. The magneto-resistance effect element as set forth in claim 1:
    wherein the close-packed faces of crystal grain of the layer under are nearly in parallel.

10. The magneto-resistance effect element as set forth in claim 1:
    wherein one main grain of the first magnetic layer is constituted of a plurality of sub-grains.

11. The magneto-resistance effect element as set forth in claim 1:
    wherein the first magnetic layer has crystal grains of an average grain diameter of 20 nm or less.

12. The magneto-resistance effect element as set forth in claim 1:
    wherein the first magnetic layer has a fcc crystal structure.

13. The magneto-resistance effect element as set forth in claim 1:
    wherein the first magnetic layer is formed of Co or a Co alloy.

14. The magneto-resistance effect element as set forth in claim 1, further comprising:
    an anti-ferromagnetic layer disposed adjacent to the second magnetic layer, wherein the second magnetic layer is pinned in its magnetization by the anti-ferromagnetic layer and magnetization of the first magnetic layer is rotated by an external magnetic field.

15. The magneto-resistance effect element as set forth in claim 14, further comprising:
    a bias magnetic field inputting film for inputting a bias magnetic field to the first magnetic layer, wherein direction of the bias magnetic field is substantially orthogonal to direction of pinned magnetization of the second magnetic layer.

16. A magneto-resistance effect element as set forth in claim 1:
    wherein film thickness of the under layer is 2.0 nm or less.

17. The magneto-resistance effect element as set forth in claim 1:
    wherein at least one kind selected from Ti, V, Cr, Mn, Nb, Mo, Tc, Hf, Ta, W, and Re is added to the under layer.

18. The magneto-resistance effect element as set forth in claim 1:
    wherein, when angles of the close-packed faces are measured at N points in the first magnetic layer and the obtained angles are sorted out into one direction among ten directions from 0° to 180°, and when a probability in a certain angle L is put as $P_m$ (L), $X^2$ (N) value obtained based on the following equation is $X^2_{0.5}$ (N) value or more and $X^2_{0.25}$ (N) value or less:

$$\text{Equation:} \quad \chi^2(N) = \frac{\sum_L \{P_m(L) \cdot N - N/10\}^2}{N/10}$$

19. The magneto-resistance effect element as set forth in claim 1;
    wherein the under layer has an identical crystal structure as that of the first magnetic layer.

20. A magnetic head, comprising:
    a lower side magnetic shield layer;
    a magneto-resistance effect element formed on the lower side magnetic shield layer through a lower side reproducing magnetic gap, the magneto-resistance effect element comprising an under layer having a crystal structure, wherein close-packed faces of crystal grains which constitute the under layer are isotopically dispersed, a spin valve film including a first magnetic layer formed on the under layer, a second magnetic layer, and a non-magnetic layer interposed between the first and the second magnetic layer, wherein close-packed faces of crystal grains which constitute the first magnetic layer are isotopically dispersed, and a pair of electrodes supplying a sense current to the spin valve film; and an upper side magnetic shield layer formed on the magneto-resistance effect element through an upper side reproducing magnetic gap.

21. The magnetic head as set forth in claim 20, further comprising:

a lower magnetic pole being in one body with the upper side magnetic shield layer;

a recording magnetic gap formed on the lower magnetic pole;

an upper magnetic pole disposed on the recording magnetic gap; and a recording coil for supplying a recording magnetic field to the lower magnetic pole and the upper magnetic pole.

22. A magnetic recording apparatus, comprising:

a magnetic recording medium; and a magnetic head recording a signal to the medium through a magnetic field and reproducing signal through the magnetic field generated from the medium, the magnetic head comprising:

a lower side magnetic shield layer;

a magneto-resistance effect element formed on the lower side magnetic shield layer through a lower side reproducing magnetic gap, the magneto-resistance effect element comprising an under layer having a crystal structure, wherein close-packed faces of crystal grains which constitute the under layer are isotopically dispersed, a spin valve film including a first magnetic layer, a second magnetic layer, and a non-magnetic layer interposed between the first and the second magnetic layer, wherein close-packed faces of crystal grains which constitute the first magnetic layer are isotopically dispersed, and a pair of electrodes supplying a sense current to the spin valve film; an upper side magnetic shield layer formed on the magneto-resistance effect element through an upper side reproducing magnetic gap;

a lower magnetic pole being in one body with the upper side magnetic shield layer;

a recording magnetic gap formed on the lower magnetic pole;

an upper magnetic pole disposed on the recording magnetic gap; and a recording coil for supplying a recording magnetic field to the lower magnetic pole and the upper magnetic pole.

* * * * *

UNITED STATES PATENT AND TRADEMARK OFFICE
CERTIFICATE OF CORRECTION

PATENT NO. : 6,052,262
DATED : April 18, 2000
INVENTOR(S) : Kamiguchi et al.

Page 1 of 1

It is certified that error appears in the above-identified patent and that said Letters Patent is hereby corrected as shown below:

Title page,
Attorney, Agent, or Firm, line 2, after "Dunner" insert --, L.L.P. --.

Claim 1, column 17,
Line 23, change "isotopically" to -- isotropically --;
Line 27, change "isotopically" to -- isotropically --.

Claim 18, column 18,
Line 51, change "$X^2$" to -- $\chi^2$ --;
Line 52, change "$X^2_{0.5}$" to -- $\chi^2_{0.5}$ --;
Line 53, change "$X^2_{0.25}$" to -- $\chi^2_{0.25}$ --.

Claim 20, column 19,
Line 5, change "isotopically" to -- isotropically --;
Line 11, change "isotopically" to isotropically --.

Claim 22, column 20,
Line 10, change "isotopically" to -- isotropically --
Line 16, change "isotopically" to -- isotropically --.

Signed and Sealed this

Second Day of October, 2001

Attest:

*Nicholas P. Godici*

NICHOLAS P. GODICI
*Acting Director of the United States Patent and Trademark Office*

*Attesting Officer*